(12) United States Patent
Lee et al.

(10) Patent No.: US 12,469,799 B2
(45) Date of Patent: Nov. 11, 2025

(54) 3D MEMORY DEVICE AND METHOD OF FORMING SEAL STRUCTURE

(71) Applicant: MACRONIX International Co., Ltd., Hsinchu (TW)

(72) Inventors: Cheng-Yu Lee, Taoyuan (TW); Teng-Hao Yeh, Hsinchu County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 524 days.

(21) Appl. No.: 17/972,953

(22) Filed: Oct. 25, 2022

(65) Prior Publication Data

US 2024/0136305 A1 Apr. 25, 2024
US 2024/0234339 A9 Jul. 11, 2024

(51) Int. Cl.
*H10B 43/27* (2023.01)
*H01L 23/00* (2006.01)
*H01L 23/58* (2006.01)

(52) U.S. Cl.
CPC .......... *H01L 23/562* (2013.01); *H01L 23/564* (2013.01); *H01L 23/585* (2013.01)

(58) Field of Classification Search
CPC ................................ H10B 43/27; H10B 43/20
See application file for complete search history.

(56) References Cited

U.S. PATENT DOCUMENTS

2015/0303214 A1* 10/2015 Kim ..................... H10D 64/512
257/329
2017/0221919 A1 8/2017 Chung
2020/0168701 A1 5/2020 Lin et al.
2020/0212041 A1 7/2020 Machkaoutsan et al.
2022/0102369 A1* 3/2022 Chung ................... H10B 43/50

FOREIGN PATENT DOCUMENTS

| JP | 2022054427 | 4/2022 |
| JP | 2022114693 | 8/2022 |
| JP | 2022136608 | 9/2022 |
| TW | 202032765 | 9/2020 |

OTHER PUBLICATIONS

"Office Action of Taiwan Counterpart Application", issued on Jul. 17, 2023, p. 1-p. 3.
"Office Action of Japan Counterpart Application", issued on Mar. 27, 2024, pp. 1-2.

* cited by examiner

*Primary Examiner* — Christopher A Johnson
(74) *Attorney, Agent, or Firm* — J.C. PATENTS

(57) ABSTRACT

The present disclosure provides a 3D memory device such as a 3D AND flash memory and a method of forming a seal structure. The 3D memory device includes a chip region including a chip array and a seal region including a seal structure. The seal structure includes a ring-shaped stack structure disposed on a substrate and surrounding the chip array and a dummy channel pillar array penetrating through the ring-shaped stack structure and including a first dummy channel pillar group and a second dummy channel pillar group. The first dummy channel pillar group includes first dummy pillars that are arranged in a first direction and a second direction crossing the first direction to surround the chip array. The second dummy channel pillar group includes second dummy pillars that are arranged in the first direction and the second direction to surround the chip array. The first and the second dummy channel pillars are staggered with each other in the first and second directions.

7 Claims, 6 Drawing Sheets

3D MEMORY DEVICE AND METHOD OF FORMING SEAL STRUCTURE

BACKGROUND OF THE INVENTION

1. Field of the Invention

The present invention relates to a semiconductor device, and particularly relates to a three-dimensional (3D) memory device and a method of forming a seal structure.

2. Description of Related Art

A non-volatile memory is widely used in personal computers and other electronic devices because it has an advantage that the stored data does not disappear after being powered off. Generally, the 3D memory, currently used in the industry, includes a NOR type memory and a NAND type memory. Moreover, another type of 3D memory is an AND type memory, which can be applied to a multi-dimensional memory array with high integration and high area utilization, and has an advantage of fast operation speed. Therefore, the development of the 3D memory has gradually become the current trend.

SUMMARY OF THE INVENTION

The present invention provides a 3D memory device in which a seal structure includes a dummy channel pillar array penetrating through a ring-shaped stack structure. The dummy channel pillar array is designed to include first dummy channel pillars and second dummy channel pillars that are staggered with each other in the first and second directions, such that the external moisture and the external stress can be prevented from affecting the chip array CA in the chip region R1.

The present invention provides a method of forming a seal structure in which the process of forming the first dummy channel pillars and the second dummy channel pillars can be integrated into a process of forming channel pillars in the chip region, such that the process steps can be simplified and the manufacturing cost can be reduced.

An embodiment of the present invention provides a 3D memory device including a chip region and a seal region surrounding the chip region. The chip region includes a chip array, and the seal region includes a seal structure. The seal structure includes a ring-shaped stack structure and a dummy channel pillar array. The ring-shaped stack structure is disposed on a substrate and surrounds the chip array. The dummy channel pillar array penetrates through the ring-shaped stack structure and includes a first dummy channel pillar group and a second dummy channel pillar group. The first dummy channel pillar group includes first dummy channel pillars arranged in a first direction and a second direction crossing the first direction to surround the chip array. The second dummy channel pillar group surrounds the first dummy channel pillar group and include second dummy channel pillars arranged in the first and second directions to surround the chip array. The first dummy channel pillars and the second dummy channel pillars are staggered with each other in the first and second directions.

In an embodiment of the present invention, the first dummy channel pillars are arranged between the two neighboring second dummy channel pillars when viewing from the first and second directions.

In an embodiment of the present invention, the two neighboring second dummy channel pillars are spaced apart from each other by a first distance in the first direction, and the first dummy channel pillars are offset from the second dummy channel pillars by the first distance in the first direction; and the two neighboring second dummy channel pillars are spaced apart from each other by a second distance in the second direction, and the first dummy channel pillars are offset from the second dummy channel pillars by the second distance in the second direction.

In an embodiment of the present invention, the first dummy channel pillars do not overlap with the second dummy channel pillars when viewing from the first and second directions.

In an embodiment of the present invention, the ring-shaped stack structure includes a dummy gate stacked structure, a first stacked structure, and a second stacked structure. The dummy gate stacked structure includes dummy gate layers electrically insulating from each other. Each of the first stacked structure and the second stacked structure includes first insulation layers and second insulation layers that are alternatively stacked with each other. The dummy gate stacked structure is between the first stacked structure and the second stacked structure.

In an embodiment of the present invention, the dummy gate stacked structure includes an insulation structure disposed on the substrate and penetrating through the dummy gate stacked structure.

In an embodiment of the present invention, each of the first dummy channel pillars and the second dummy channel pillars includes a ring-shaped channel pillar and a conductive pillar in the ring-shaped channel pillar. The conductive pillar extends into the substrate to electrically connect to a conductive layer in the substrate.

In an embodiment of the present invention, the 3D memory device further includes upper conductive layers disposed on the ring-shaped stack structure and vias disposed between the upper conductive layers and the ring-shaped stack structure. Each via electrically connects the conductive pillar to the corresponding upper conductive layer.

An embodiment of the present invention provides a method of forming a seal structure including: forming a ring-shaped stack structure surrounding a chip array on a substrate; and forming a dummy channel pillar array penetrating through the ring-shaped stack structure. The dummy channel pillar array is formed to include a first dummy channel pillar group and a second dummy channel pillar group. The first dummy channel pillar group includes first dummy channel pillars arranged in a first direction and a second direction crossing the first direction to surround the chip array. The second dummy channel pillar group surrounds the first dummy channel pillar group and includes second dummy channel pillars arranged in the first and second directions to surround the chip array. The first dummy channel pillars and the second dummy channel pillars are staggered with each other in the first and second directions.

In an embodiment of the present invention, the first dummy channel pillars are formed between the two neighboring second dummy channel pillars when viewing from the first and second directions.

In an embodiment of the present invention, the two neighboring second dummy channel pillars are spaced apart from each other by a first distance in the first direction, and the first dummy channel pillars are offset from the second dummy channel pillars by the first distance in the first direction; and the two neighboring second dummy channel pillars are spaced apart from each other by a second distance in the second direction, and the first dummy channel pillars are offset from the second dummy channel pillars by the second distance in the second direction.

In an embodiment of the present invention, the first dummy channel pillars do not overlap with the second dummy channel pillars when viewing from the first and second directions.

In an embodiment of the present invention, the ring-shaped stack structure includes a dummy gate stacked structure, a first stacked structure, and a second stacked structure. The dummy gate stacked structure includes dummy gate layers electrically insulating from each other. Each of the first stacked structure and the second stacked structure includes first insulation layers and second insulation layers that are alternatively stacked with each other. The dummy gate stacked structure is between the first stacked structure and the second stacked structure.

In an embodiment of the present invention, a step of forming the dummy gate stacked structure, the first stacked structure, and the second stacked structure includes: performing a patterning process on the ring-shaped stack structure to form a trench penetrating through the ring-shaped stack structure, wherein the trench exposes sidewalls of the first insulation layers and sacrificial layers that are alternatively stacked with each other in the ring-shaped stack structure; forming horizontal openings between the two neighboring first insulation layers by removing portions of the sacrificial layers through the trench; and forming the dummy gate layers in the horizontal openings to form the dummy gate stacked structure, the first stacked structure, and the second stacked structure. Other portions of the sacrificial layers that are not removed form the second insulation layers.

In an embodiment of the present invention, the method further includes filling an insulation material into the trench to form an insulation structure.

In an embodiment of the present invention, each of the first dummy channel pillars and the second dummy channel pillars includes a ring-shaped channel pillar and a conductive pillar in the ring-shaped channel pillar, and the conductive pillar extends into the substrate to electrically connect to a conductive layer in the substrate.

In an embodiment of the present invention, the method further include: forming upper conductive layers on the ring-shaped stack structure; and forming vias between the upper conductive layers and the ring-shaped stack structure, wherein the vias are each configured to electrically connect the conductive pillar to the corresponding upper conductive layer.

Based on the above, the seal structure in the 3D memory device includes the dummy channel pillar array penetrating through the ring-shaped stack structure, and the dummy channel pillar array is designed to include first dummy channel pillars and second dummy channel pillars that are staggered with each other in the first and second directions, such that the external moisture and the external stress can be prevented from affecting the chip array in the chip region. On the other hand, in the method of forming the seal structure, the process of forming the first dummy channel pillars and the second dummy channel pillars can be integrated into the process of forming the channel pillars in the chip region, such that the process steps can be simplified and the manufacturing cost can be reduced.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
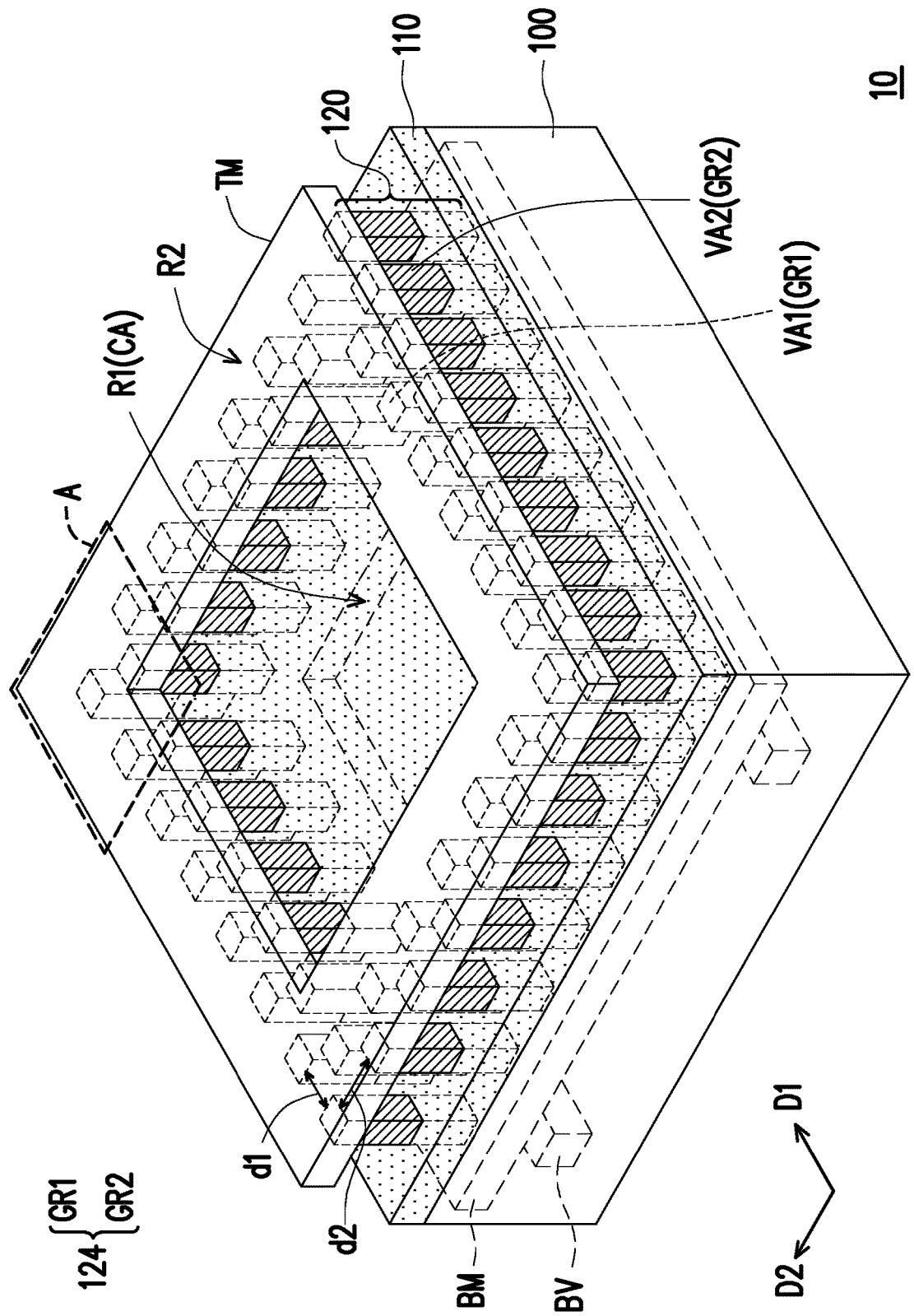
FIG. 1 is a schematic perspective view showing a 3D memory device according to the first embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The invention will be described more comprehensively below with reference to the drawings for the embodiments. However, the invention may also be implemented in different forms rather than being limited by the embodiments described in the invention. Thicknesses of layer and region in the drawings are enlarged for clarity. The same reference numbers are used in the drawings and the description to indicate the same or like parts, which are not repeated in the following embodiments.

It will be understood that when an element is referred to as being "on" or "connected" to another element, it may be directly on or connected to the other element or intervening elements may be present. If an element is referred to as being "directly on" or "directly connected" to another element, there are no intervening elements present. As used herein, "connection" may refer to both physical and/or electrical connections, and "electrical connection" or "coupling" may refer to the presence of other elements between two elements.

As used herein, "about", "approximately" or "substantially" includes the values as mentioned and the average values within the range of acceptable deviations that can be determined by those of ordinary skill in the art. Consider to the specific amount of errors related to the measurements (i.e., the limitations of the measurement system), the meaning of "about" may be, for example, referred to a value within one or more standard deviations of the value, or within ±30%, ±20%, ±10%, ±5%. Furthermore, the "about", "approximate" or "substantially" used herein may be based on the optical property, etching property or other properties to select a more acceptable deviation range or standard deviation, but may not apply one standard deviation to all properties.

The terms used herein are used to merely describe exemplary embodiments and are not used to limit the present disclosure. In this case, unless indicated in the context specifically, otherwise the singular forms include the plural forms.

Figure 2:
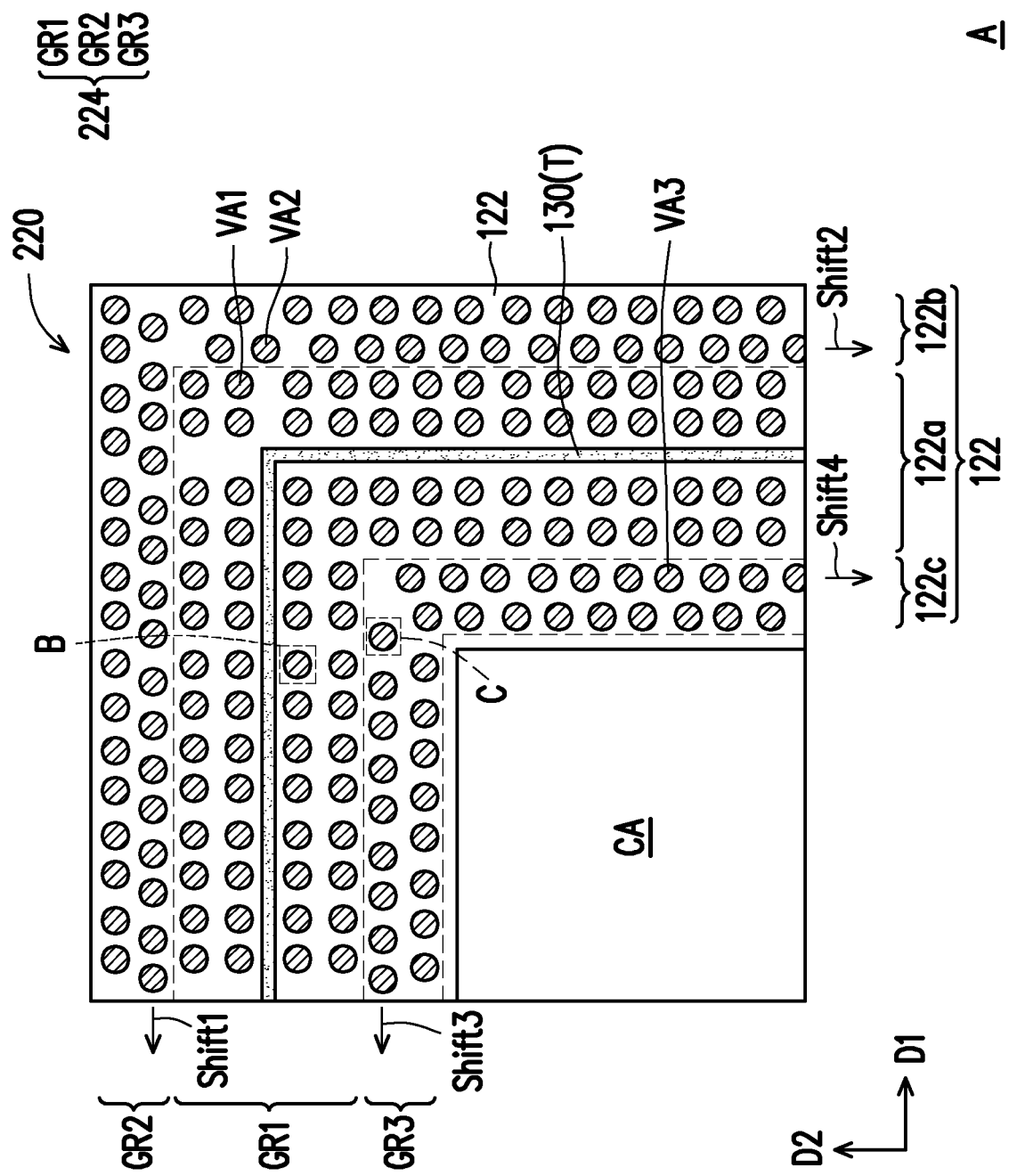
FIG. 2 is a schematic top view showing a portion of a 3D memory device corresponding to an area A of FIG. 1 according to the second embodiment of the present invention.
Figure 3:
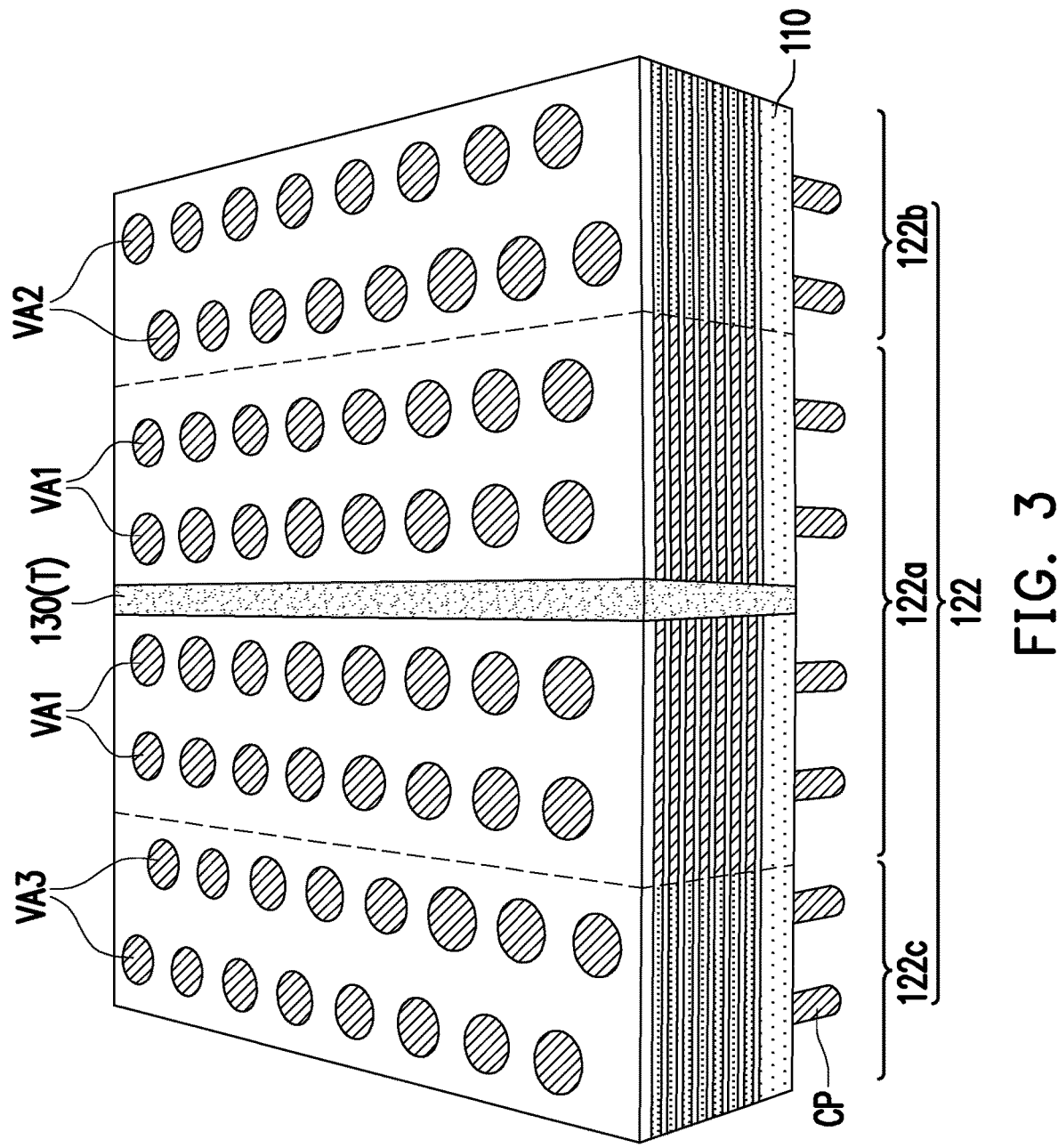
FIG. 3 is a schematic perspective view of FIG. 2 observed through an angle of view.
Figure 4:
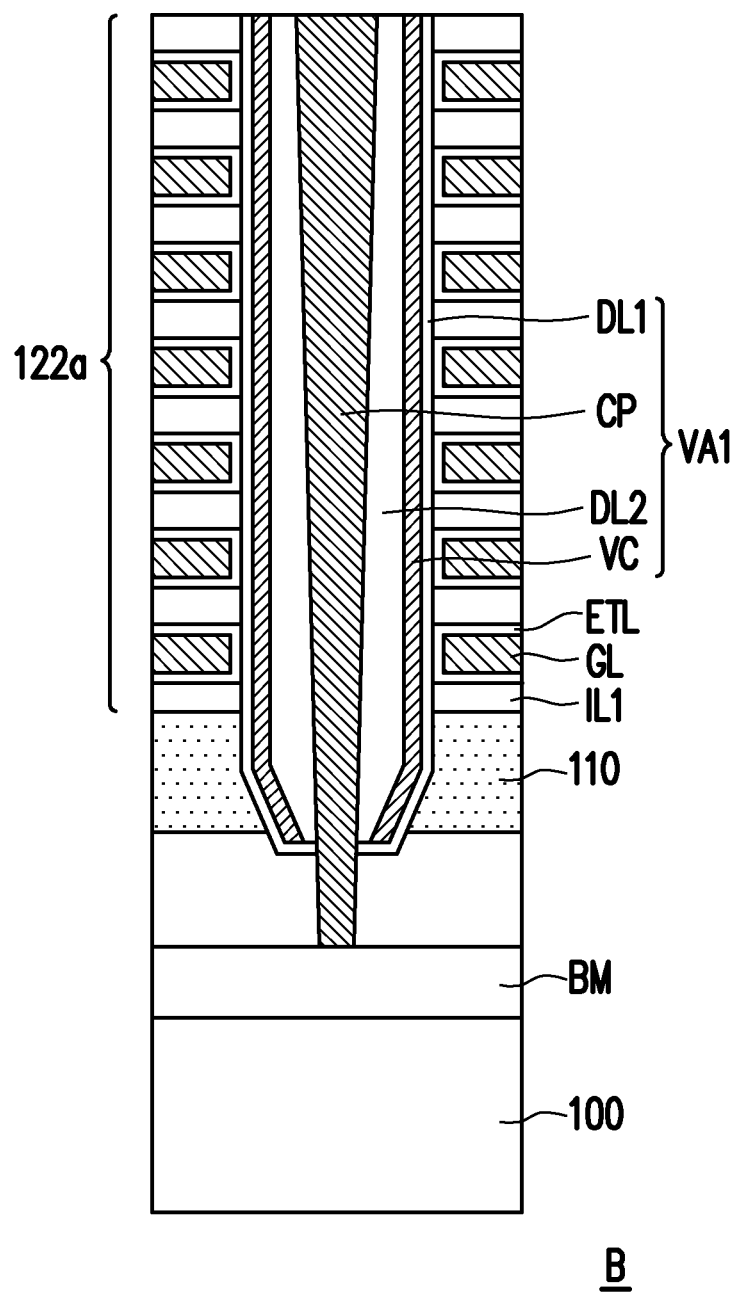
FIG. 4 is a schematic cross-sectional view of an area B in FIG. 2.
Figure 5:
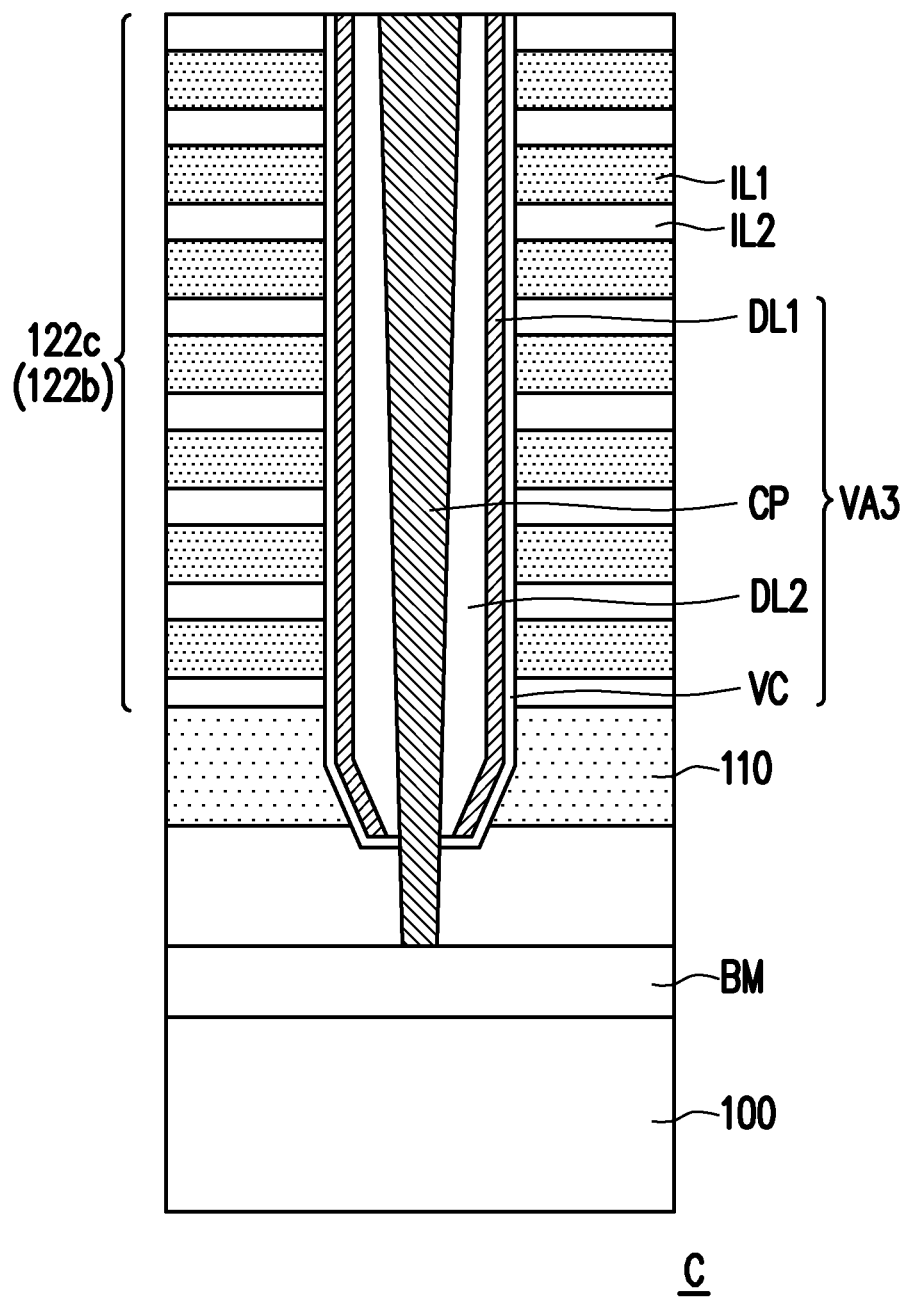
FIG. 5 is a schematic cross-sectional view of an area C in FIG. 2.

FIG. 1 is a schematic perspective view showing a 3D memory device according to the first embodiment of the present invention. For the convenience of explanation, FIG. 1 only illustrates a portion of the components of the 3D memory device 10, such as a substrate 100, an etching stop layer 110, a seal structure 120, a dummy channel pillar array 124, first dummy channel pillars VA1, second dummy channel pillars VA2, a conductive layer BM, conductive vias BV, and a conductive layer TM. FIG. 2 is a schematic top view showing a portion of a 3D memory device corresponding to an area A of FIG. 1 according to the second embodiment of the present invention. For the convenience of explanation, the conductive layer TM in FIG. 2 is omitted to clearly describe the arrangement of the dummy channel pillar array 224 of the seal structure 220. FIG. 3 is a schematic perspective view of FIG. 2 observed through an angle of view (e.g., a viewing angle along the first direction D1 or the second direction D2). For the convenience of explanation, some of components such as the conductive layer TM and substrate 100 are omitted to clearly describe the arrangement of the dummy channel pillar array 224 of the seal structure 220. FIG. 4 is a schematic cross-sectional view of an area B in FIG. 2. FIG. 5 is a schematic cross-sectional view of an area C in FIG. 2.

Referring to FIG. 1, the 3D memory device 10 includes a chip region R1 and a seal region R2 surrounding the chip region R1. The chip region R1 includes a chip array CA, and the seal region R2 includes a seal structure 120. In some embodiments, the seal structure 120 may be a die seal structure. The 3D memory device 10 may be a 3D AND flash memory device. The 3D memory device 10 may include a memory structure such as a memory structure where CMOS arranged about the memory array (CMOS and Array, CNA) or a memory structure where CMOS arranged under the memory array (CMOS under Array, CUA).

The seal structure 120 includes a ring-shaped stack structure 122 (as shown in FIG. 2) and a dummy channel pillar array 124. The ring-shaped stack structure 122 is disposed on a substrate 100 and surrounds the chip array CA. The dummy channel pillar array 124 penetrates through the ring-shaped stack structure 122.

The substrate 100 may include components formed on a semiconductor substrate or a semiconductor on insulator (SOI) substrate. The components may include, for example, interlayer dielectric (ILD) layers and/or contacts, intermetal dielectric (IMD) layers and/or vias (e.g., an interconnection structure formed in a back-end of line (BEoL) process), or active elements (e.g., PMOS, NMOS, CMOS, JFET, or BJT). As shown in FIG. 1, the substrate 100 may include a conductive layer BM and conductive vias BV formed in the BEoL process. A semiconductor material in the semiconductor substrate or the SOI substrate may include element semiconductor (e.g., Si, or Ge), an alloy semiconductor (e.g., SiG), or a compound semiconductor (e.g., III-V semiconductor). The semiconductor material may be doped with a dopant of p-type or n-type, so that the substrate 100 may have a conductivity type of p-type or n-type. The conductive layer BM and the conductive vias BV may each independently include tungsten (W), cobalt (Co), aluminum (Al), tungsten silicide (WSix), or cobalt silicide (CoSix).

The etching stop layer 110 may be disposed on the substrate 100. In some embodiments, the etching stop layer 110 may be disposed between the substrate 100 and the ring-shaped stack structure 122. The material of the etching stop layer 110 may include a polysilicon. In some embodiments, the dummy channel pillar array 124 may penetrate through the etching stop layer 110 and may extend into the substrate 100 to contact the conductive layer BM. In some embodiments, the conductive layer BM may electrically connect to the conductive vias BV. FIG. 1 is an exemplary embodiment showing one conductive layer BM and two conductive vias BV, however, the number of the conductive layer BM and the number of the conductive vias BV are not limited thereto.

As shown in FIG. 1, the dummy channel pillar array 124 includes first dummy channel pillar group GR1 and a second dummy channel pillar group GR2 surrounding the first dummy channel pillar group GR1. The first dummy channel pillar group GR1 includes first dummy channel pillars VA1 arranged in a first direction D1 and a second direction D2 crossing the first direction D1 to surround the chip array CA. The second dummy channel pillar group GR2 includes second dummy channel pillars VA2 arranged in the first and second directions D1 and D2 to surround the chip array CA. The first dummy channel pillars VA1 and the second dummy channel pillars VA2 are staggered with each other in the first and second directions D1 and D2, such that the external moisture and the external stress can be prevented from affecting the chip array CA in the chip region R1.

In some embodiments, the first dummy channel pillars VA1 may be arranged between the two neighboring second dummy channel pillars VA2 when viewing from the first and second directions D1 and D2. In some embodiments, the two neighboring second dummy channel pillars VA2 are spaced apart from each other by a first distance d1 in the first direction D1, and the first dummy channel pillars VA1 are offset from the second dummy channel pillars VA2 by the first distance d1 in the first direction D1; and the two neighboring second dummy channel pillars VA2 are spaced apart from each other by a second distance d2 in the second direction D2, and the first dummy channel pillars VA1 are offset from the second dummy channel pillars VA2 by the second distance d2 in the second direction D2. In the case where the first dummy channel pillars VA1 and the second dummy channel pillars VA2 have the same size in the first direction D1 and being equal to the first distance d1, and the first dummy channel pillars VA1 and the second dummy channel pillars VA2 have the same size in the second direction D2 and being equal to the second distance d2, the above arrangement (i.e., the first dummy channel pillars VA1 are offset from the second dummy channel pillars VA2 by the first distance d1 in the first direction D1, and the first dummy channel pillars VA1 are offset from the second dummy channel pillars VA2 by the second distance d2 in the second direction D2) may prevent the external moisture and the external stress from affecting the chip array CA in the chip region R1. In some embodiments, the first dummy channel pillars VA1 do not overlap with the second dummy channel pillars VA2 when viewing from the first and second directions D1 and D2.

FIG. 1 is an exemplary embodiment showing the first dummy channel pillars VA1 being arranged in one rectangle and the second dummy channel pillars VA2 being arranged in one rectangle, but the present invention is not limited thereto. The arrangements and the numbers of the first dummy channel pillars VA1 and the second dummy channel pillars VA2 can be adjusted according to the design.

Referring to FIG. 2 and FIG. 3, the dummy channel pillar array 224 of the seal structure 220 may include a first dummy channel pillar group GR1, a second dummy channel pillar group GR2, and a third dummy channel pillar group GR3. In some embodiments, the second dummy channel pillar group GR2 may surround the first dummy channel pillar group GR1, and the first dummy channel pillar group GR1 may be disposed between the second dummy channel pillar group GR2 and the third dummy channel pillar group GR3. The first dummy channel pillar group GR1, the second dummy channel pillar group GR2, and the third dummy channel pillar group GR3 may include first dummy channel pillars VA1, second dummy channel pillars VA2, and third dummy channel pillars VA3, respectively. The first dummy channel pillars VA1, the second dummy channel pillars VA2, and the third dummy channel pillars VA3 may each arrange in the first and second directions D1 and D2 to surround the chip array CA.

In some embodiments, the first dummy channel pillar group GR1 may include the first dummy channel pillars VA1 that are arranged in 4 columns and 4 rows and surrounds the chip array CA. In some embodiments, the first dummy channel pillars VA1 may be aligned with each other in the first and second directions D1 and D2 (as shown in FIG. 2).

In some embodiments, the second dummy channel pillar group GR2 may include the second dummy channel pillars VA2 that are arranged in 2 columns and 2 rows and surrounds the chip array CA. In some embodiments, as shown in FIG. 2, one row of the second dummy channel pillars VA2 is designed to be offset by a distance Shift1 in the first direction D1, such that the one row of the second dummy channel pillars VA2 is staggered with another row of the second dummy channel pillars VA2 in the first direction D1, and the one row of the second dummy channel pillars VA2 is also staggered with the first dummy channel pillars VA1 in the first dummy channel pillar group GR1 in the first direction D1. In this way, the external moisture and the external stress can be prevented from affecting the chip array CA in the chip region R1.

In some other embodiments, as shown in FIG. 2, one column of the second dummy channel pillars VA2 is designed to be offset by a distance Shift2 in the second direction D2, such that the one column of the second dummy channel pillars VA2 is staggered with another one column of the second dummy channel pillars VA2 in the second direction D2, and the one column of the second dummy channel pillars VA2 is also staggered with the first dummy channel pillars VA1 in the first dummy channel pillar group GR1 in the second direction D2. In this way, the external moisture and the external stress can be prevented from affecting the chip array CA in the chip region R1.

In some embodiments, the third dummy channel pillar group GR3 may include the third dummy channel pillars VA3 that are arranged in 2 columns and 2 rows and surrounds the chip array CA. In some embodiments, as shown in FIG. 2, one row of the third dummy channel pillars VA3 is designed to be offset by a distance Shift3 in the first direction D1, such that the one row of the third dummy channel pillars VA3 is staggered with another row of the third dummy channel pillars VA3 in the first direction D1, and the one row of the third dummy channel pillars VA3 is also staggered with the first dummy channel pillars VA1 in the first dummy channel pillar group GR1 in the first direction D1. In this way, the external moisture and the external stress can be prevented from affecting the chip array CA in the chip region R1.

In some other embodiments, as shown in FIG. 2, one column of the third dummy channel pillars VA3 is designed to be offset by a distance Shift4 in the second direction D2, such that the one column of the third dummy channel pillars VA3 is staggered with another one of the third dummy channel pillars VA3 in the second direction D2, and the one column of the third dummy channel pillars VA3 is also staggered with the first dummy channel pillars VA1 in the first dummy channel pillar group GR1 in the second direction D2. In this way, the external moisture and the external stress can be prevented from affecting the chip array CA in the chip region R1.

In some embodiments, a process of forming the dummy channel pillars (e.g., first dummy channel pillars VA1, second dummy channel pillars VA2, and third dummy channel pillars VA3) can be integrated into a process of forming the channel pillars (not shown) in the chip region R1, such that the process steps can be simplified and the manufacturing cost can be reduced.

In some embodiments, referring to FIG. 2 to FIG. 5, the dummy channel pillars (e.g., first to third dummy channel pillars VA1 to VA3) may include ring-shaped channel pillars (e.g., ring-shaped channel pillars VC shown in FIG. 4 and FIG. 5) and conductive pillars (e.g., conductive pillars CP shown in FIG. 4 and FIG. 5) in the ring-shaped channel pillars.

The ring-shaped channel pillars VC may be disposed on the substrate 100 and penetrate through the ring-shaped stack structure 122. In some embodiments, the ring-shaped channel pillars VC may penetrate the ring-shaped stack structure 122 and the etching stop layer 110 and may extend into the substrate 100. In some embodiments, the ring-shaped channel pillars VC may be continuous in an extension direction thereof (e.g., a direction perpendicular to the substrate 100). In other words, the ring-shaped channel pillars VC are integral in the extension direction thereof, and it is not divided into multiple disconnected parts. In some embodiments, the ring-shaped channel pillars VC may have a circular profile when viewed from the top, but the invention is not limited thereto. In some other embodiments, the ring-shaped channel pillars VC may have other profiles (e.g., polygonal shape) when viewed from the top. The materials of the channel pillars VC may be semiconductor materials, such as undoped polysilicon.

The conductive pillars CP may extend into the substrate 100 to electrically connect to the conductive layer BM in the substrate 100. The materials of the conductive pillars CP may include tungsten (W), cobalt (Co), aluminum (Al), tungsten silicide (WSix), or cobalt silicide (CoSix).

In some embodiments, the dummy channel pillars (e.g., first to third dummy channel pillars VA1 to VA3) may include dielectric layers DL1 disposed between the ring-shaped channel pillars VC and the ring-shaped stack structure 122. In some embodiments, the dielectric layers DL1 may extend into the etching stop layer 110. In some embodiments, the dielectric layers DL1 may penetrate through the etching stop layer 110 and may be located in the substrate 100. The materials of the dielectric layers DL1 include silicon oxide.

In some embodiments, the dummy channel pillars (e.g., first to third dummy channel pillars VA1 to VA3) may include dielectric layers DL2. The dielectric layers DL2 may be disposed between the ring-shaped channel pillars VC and the conductive pillars CP. The materials of the dielectric layers DL2 include silicon oxide.

In some embodiments, the ring-shaped stack structure 122 may include a dummy gate stacked structure 122a, a first stacked structure 122b, and a second stacked structure 122c. In some embodiments, as shown in FIG. 2, the dummy gate stacked structure 122a may be disposed between the first stacked structure 122b and the second stacked structure 122c. In some embodiments, the first dummy channel pillars VA1 may penetrate through the dummy gate stacked structure 122a in the ring-shaped stack structure 122. In some embodiments, the second dummy channel pillars VA2 may penetrate through the first stacked structure 122b in the ring-shaped stack structure 122. In some embodiments, the third dummy channel pillars VA3 may penetrate through the second stacked structure 122c in the ring-shaped stack structure 122.

Referring to FIG. 4, the dummy gate stacked structure 122a may include dummy gate layers GL electrically insulating from each other. The materials of the dummy gate layers GL may include tungsten (W), cobalt (Co), aluminum (Al), tungsten silicide (WSix), or cobalt silicide (CoSix). In some embodiments, the dummy gate stacked structure 122a may include insulation layers IL1, and the dummy gate layers GL are disposed between the two neighboring insulation layers IL1. The materials of the insulation layers IL1 may include silicon oxide. In some embodiments, the dummy gate stacked structure 122a may include dummy charge storage structures ETL disposed between each of the dummy gate layers GL and the corresponding ring-shaped channel pillar VC. In some embodiments, the dummy charge storage structures ETL may be oxide-nitride-oxide (ONO) composite layers.

In some embodiments, the dummy gate stacked structure 122a may include an insulation structure 130 disposed on the substrate 100 and penetrating through the dummy gate stacked structure 122a (as shown in FIG. 2 and FIG. 3). The material of the insulation structure 130 may include an organic insulation material, an inorganic insulation material, or a combination thereof.

Referring to FIG. 5, the first stacked structure 122b and the second stacked structure 122c may each include first insulation layers IL1 and second insulation layers IL2 alternatively stacked with each other. The materials of the first insulation layers IL1 may be different from the materials of the second insulation layers IL2. For example, the materials of the first insulation layers IL1 may be silicon oxide, and the materials of the second insulation layers IL2 may be silicon nitride.

In some embodiments, the 3D memory device 10 may further include a conductive layer TM disposed on the seal structure 120. The conductive layer TM may be electrically connected to the dummy channel pillar array 124 in the seal structure 120. The conductive layer TM may include tungsten (W), cobalt (Co), aluminum (Al), tungsten silicide (WSix), or cobalt silicide (CoSix).

Figure 6:
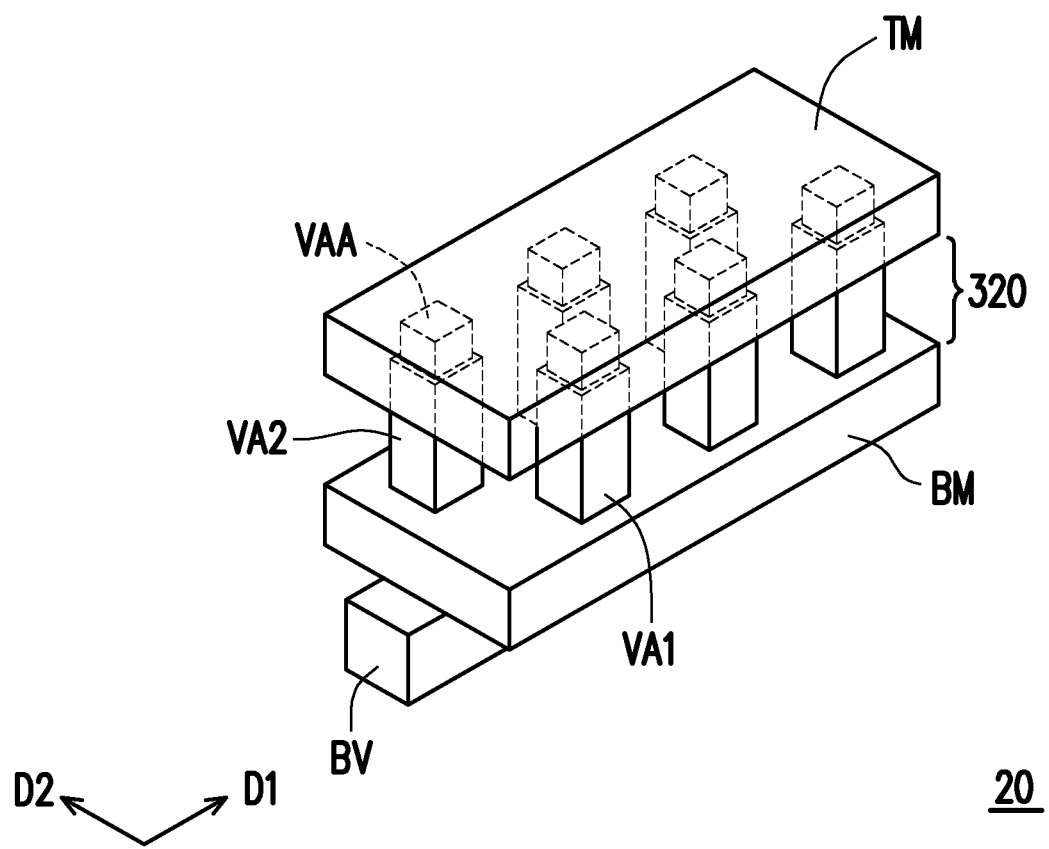
FIG. 6 is a schematic perspective view showing a portion of a 3D memory device according to the third embodiment of the present invention.

FIG. 6 is a schematic perspective view showing a portion of a 3D memory device according to the third embodiment of the present invention. For the convenience of explanation, FIG. 6 only illustrates a conductive via BV, a conductive layer BM, dummy channel pillars VA1 and VA2, a seal structure 320, a conductive layer TM, and vias VAA. The difference between the 3D memory device 10 shown in FIG. 1 and the 3D memory device 20 shown in FIG. 6 is that the seal structure 320 of the 3D memory device 20 further includes vias VAA.

In this embodiment, the seal structure 320 includes vias VAA formed between the top surfaces of the dummy channel pillars (e.g., first dummy channel pillars VA1/second dummy channel pillars VA2) and the bottom surface of the conductive layer TM. The vias VAA may electrically connect the conductive pillars CP of the dummy channel pillars (e.g., first dummy channel pillars VA1/second dummy channel pillars VA2) to the corresponding upper conductive layers TM. In some embodiments, the size of the vias VAA may be smaller than the size of the first dummy channel pillars VA1/second dummy channel pillars VA2. The materials of the vias may include tungsten (W), cobalt (Co), aluminum (Al), tungsten silicide (WSix), or cobalt silicide (CoSix). In some embodiments, the vias VAA and the conductive layer TM may be formed by a dual damascene process.

Hereinafter, a method of forming a seal structure will be described by using FIGS. 1 to 5, for example. However, the method of forming the seal structure is not limited thereto. In addition, the same or similar components are represented by the same or similar reference numerals, and will not be repeated here.

Firstly, referring to FIG. 1 and FIG. 2, a ring-shaped stack structure 122 surrounding a chip array CA is formed on a substrate 100. Then, a dummy channel pillar array 124 is formed to penetrate through the ring-shaped stack structure 122. The dummy channel pillar array 124 includes a first dummy channel pillar group GR1 and a second dummy channel pillar group GR2 surrounding the first dummy channel pillar group GR1. The first dummy channel pillar group GR1 includes first dummy channel pillars VA1 arranged in the first direction D1 and the second direction D2 to surround the chip array CA. The second dummy channel pillar group GR2 includes second dummy channel pillars VA2 arranged in the first direction D1 and the second direction D2 to surround the chip array CA. The first dummy channel pillars VA1 and the second dummy channel pillars VA2 are staggered with each other in the first and second directions D1 and D2, such that the external moisture and the external stress can be prevented from affecting the chip array CA in the chip region R1.

In some embodiments, the ring-shaped stack structure 122 may include a dummy gate stacked structure 122a, a first stacked structure 122b, and a second stacked structure 122c. In some embodiments, as shown in FIG. 2, the dummy gate stacked structure 122a may be disposed between the first stacked structure 122b and the second stacked structure 122c. The dummy gate stacked structure 122a may include dummy gate layers GL electrically insulating from each other. The first stacked structure 122b and the second stacked structure 122c may each include first insulation layers IL1 and second insulation layers IL2 alternatively stacked with each other.

In some embodiments, the dummy gate stacked structure 122a, the first stacked structure 122b, and the second stacked structure 122c may be formed by following steps. Firstly, a patterning process is performed on the ring-shaped stack structure 122 to form a trench T penetrating through the ring-shaped stack structure 122 and the etching stop layer 110 (as shown in FIG. 3). The trench T exposes sidewalls of the first insulation layers IL1 and sacrificial layers (after the subsequent process of forming horizontal openings, the remaining sacrificial layers are called the second insulation layers IL2) that are alternatively stacked with each other in the ring-shaped stack structure 122. Then, horizontal openings (not shown) are formed between the two neighboring first insulation layers IL1 by removing portions of the sacrificial layers through the trench T. After that, the dummy gate layers GL are formed in the horizontal openings to form the dummy gate stacked structure 122a, the first stacked structure 122b, and the second stacked structure 122c, wherein other portions of the sacrificial layers that are not removed may form the second insulation layers IL2.

Based on the above, a process of forming the seal structure (e.g., seal structure 120, 220, or 320) is compatible to a process of forming gate layers in the chip region R1 (e.g., being compatible to a gate replacement process). In some embodiments, the insulation material may fill in the trench T to form the insulation structure 130 after the dummy gate layers GL are formed (as shown in FIG. 3).

In some embodiments, referring to FIG. 2 to FIG. 5, the dummy channel pillars (e.g., first to third dummy channel pillars VA1 to VA3) may include ring-shaped channel pillars (e.g., ring-shaped channel pillars VC shown in FIG. 4 and FIG. 5) and conductive pillars (e.g., conductive pillars CP shown in FIG. 4 and FIG. 5) in the ring-shaped channel pillars. In some embodiments, a process of forming the dummy channel pillars (e.g., first dummy channel pillars VA1, second dummy channel pillars VA2, and third dummy channel pillars VA3) can be integrated into a process of forming the channel pillars (not shown) in the chip region R1, such that the process steps can be simplified and the manufacturing cost can be reduced.

Based on the above, the seal structure in each of the 3D memory devices of the aforementioned embodiments includes dummy channel pillar array penetrating through the ring-shaped stack structure, and the dummy channel pillar array is designed to include first dummy channel pillars and second dummy channel pillars that are staggered with each other in the first and second directions, such that the external moisture and the external stress can be prevented from affecting the chip array in the chip region. On the other hand, in the method of forming the seal structure, the process of forming the first dummy channel pillars and the second dummy channel pillars can be integrated into the process of forming the channel pillars in the chip region, such that the process steps can be simplified and the manufacturing cost can be reduced. For example, the seal structures in the above embodiments may be integrated into the process of forming the channel pillars in the chip region as compared to a trench-type die seal structure, such that the additional process of forming the trench-type die seal structure can be omitted.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A three-dimensional (3D) memory device comprising a chip region and a seal region surrounding the chip region, wherein the chip region comprises a chip array, and the seal region comprises a seal structure comprising:
    a ring-shaped stack structure disposed on a substrate and surrounding the chip array; and
    a dummy channel pillar array penetrating through the ring-shaped stack structure and comprising:
        a first dummy channel pillar group comprising first dummy channel pillars arranged in a first direction and a second direction crossing the first direction to surround the chip array; and
        a second dummy channel pillar group surrounding the first dummy channel pillar group and comprising second dummy channel pillars arranged in the first and second directions to surround the chip array,
    wherein the first dummy channel pillars and the second dummy channel pillars are staggered with each other in the first and second directions, and the first dummy channel pillars are arranged between the two neighboring second dummy channel pillars when viewing from the first and second directions.

2. The 3D memory device of claim 1, wherein:
    some of the two neighboring second dummy channel pillars are spaced apart from each other by a first distance in the first direction, and some of the first dummy channel pillars are offset from the second dummy channel pillars by the first distance in the first direction; and
    some of the two neighboring second dummy channel pillars are spaced apart from each other by a second distance in the second direction, and some of the first dummy channel pillars are offset from the second dummy channel pillars by the second distance in the second direction.

3. The 3D memory device of claim 1, wherein:
    the first dummy channel pillars do not overlap with the second dummy channel pillars when viewing from the first and second directions.

4. The 3D memory device of claim 1, wherein the ring-shaped stack structure comprises:
    a dummy gate stacked structure comprising dummy gate layers electrically insulating from each other; and
    a first stacked structure and a second stacked structure, each comprising first insulation layers and second insulation layers that are alternatively stacked with each other, wherein the dummy gate stacked structure is between the first stacked structure and the second stacked structure.

5. The 3D memory device of claim 4, wherein the dummy gate stacked structure comprises an insulation structure disposed on the substrate and penetrating through the dummy gate stacked structure.

6. The 3D memory device of claim 1, wherein each of the first dummy channel pillars and the second dummy channel pillars comprises a ring-shaped channel pillar and a conductive pillar in the ring-shaped channel pillar, and the conductive pillar extends into the substrate to electrically connect to a conductive layer in the substrate.

7. The 3D memory device of claim 6, further comprising:
    upper conductive layers disposed on the ring-shaped stack structure; and
    vias disposed between the upper conductive layers and the ring-shaped stack structure, and each electrically connecting the conductive pillar to the corresponding upper conductive layer.

* * * * *